United States Patent
Galbraith et al.

(10) Patent No.: US 11,716,097 B2
(45) Date of Patent: Aug. 1, 2023

(54) SIGNAL CORRECTION USING SOFT INFORMATION IN A DATA CHANNEL

(71) Applicant: Western Digital Technologies, Inc., San Jose, CA (US)

(72) Inventors: Richard Galbraith, Rochester, MN (US); Niranjay Ravindran, Rochester, MN (US); Iouri Oboukhov, Rochester, MN (US); Pradhan Bellam, Rochester, MN (US); Henry Yip, Bellflower, CA (US); Jonas Goode, Lake Forest, CA (US); Weldon M. Hanson, Rochester, MN (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/564,485

(22) Filed: Dec. 29, 2021

(65) Prior Publication Data

US 2023/0208445 A1    Jun. 29, 2023

(51) Int. Cl.
*H03M 13/29* (2006.01)
*H03M 13/37* (2006.01)
*H03M 13/39* (2006.01)

(52) U.S. Cl.
CPC ... *H03M 13/2948* (2013.01); *H03M 13/3746* (2013.01); *H03M 13/3784* (2013.01); *H03M 13/3769* (2013.01); *H03M 13/3972* (2013.01)

(58) Field of Classification Search
CPC ......... H03M 13/2948; H03M 13/3746; H03M 13/3784
See application file for complete search history.

(56) References Cited

U.S. PATENT DOCUMENTS

| | | | |
|---|---|---|---|
| 4,829,267 A | 5/1989 | Sandusky | |
| 5,355,356 A | 10/1994 | Johann et al. | |
| 5,701,314 A | 12/1997 | Armstrong et al. | |
| 6,307,901 B1 * | 10/2001 | Yu | H04L 1/0066 375/233 |
| 6,404,578 B1 | 6/2002 | Bhandari et al. | |
| 6,414,806 B1 | 7/2002 | Gowda et al. | |
| 6,594,094 B2 | 7/2003 | Rae et al. | |
| 7,330,320 B1 | 2/2008 | Oberg et al. | |
| 7,379,452 B2 | 5/2008 | Behrens et al. | |

(Continued)

FOREIGN PATENT DOCUMENTS

EP    0 320 022    3/1994

*Primary Examiner* — Joseph D Torres
(74) *Attorney, Agent, or Firm* — Patent Law Works LLP

(57) ABSTRACT

Example systems, read channel circuits, data storage devices, and methods to provide signal correction based on soft information in a read channel are described. The read channel circuit includes a soft output detector, such as a soft output Viterbi algorithm (SOVA) detector, and a signal correction circuit. The soft output detector passes detected data bits and corresponding soft information to the signal correction circuit. The signal correction circuit uses the soft information to determine a signal correction value, which is combined with input signal to return a corrected signal to the soft output detector for a next iteration. In some configurations, the signal correction value may compensate for DC offset, AC coupling poles, and/or signal asymmetries to reduce baseline wander in the read channel.

21 Claims, 5 Drawing Sheets

(56) References Cited

U.S. PATENT DOCUMENTS

| | | | |
|---|---|---|---|
| 7,587,657 B2* | 9/2009 | Haratsch | H03M 13/455 |
| | | | 714/780 |
| 7,602,567 B2 | 10/2009 | Park et al. | |
| 7,885,031 B1 | 2/2011 | Han | |
| 8,155,246 B2 | 4/2012 | Venkatachalam et al. | |
| 8,255,763 B1* | 8/2012 | Yang | H03M 13/2957 |
| | | | 714/755 |
| 2007/0266274 A1* | 11/2007 | Lin | H03M 13/2778 |
| | | | 714/699 |
| 2010/0251076 A1* | 9/2010 | Wu | H03M 13/6516 |
| | | | 714/780 |

* cited by examiner

SIGNAL CORRECTION USING SOFT INFORMATION IN A DATA CHANNEL

TECHNICAL FIELD

The present disclosure relates to data channels for data storage devices, such as hard disk drives. In particular, the present disclosure relates to compensation for sources of signal error, such as the magnetic AC pole created by the soft underlayer in perpendicular recording, within the read channel.

BACKGROUND

In present-day data transmission and storage mediums, such as disk, tape, optical, mechanical, and solid-state storage drives, data detection is based in large part on techniques developed in the early years of the data storage industry. While recently developed read channels invoke relatively new data encoding and detection schemes such as iterative detection and low-density parity codes (LDPC), much of the signal processing power in today's read channels is still based on partial-response maximum-likely-hood detection (PRML), developed in the early 1990's. Iterative LDPC code detectors use successive iterations and calculated reliability values to arrive at the most likely value for each bit. Soft information may be calculated for each bit and is sometimes represented by a log likelihood ratio (LLR) value, which is the natural logarithm of the ratio of the probability that the bit is a 1 divided by the probability that the bit is a 0. In some configurations a soft output Viterbi algorithm (SOVA) detector that determines LLR values for each bit may be paired with an iterative decoder for determining bias values for the next iteration of the SOVA. For example, a SOVA detector may be paired with an LDPC decoder that receives bit LLR values, returns extrinsic LLR values, and outputs hard decisions when LDPC constraints are met.

In data storage devices using magnetic storage mediums, the SOVA detectors and LDPC decoders in a read channel may be dependent on a digital input signal, such as an equalized digital signal received from an analog front-end of the read channel that converts the analog input signal read from the magnetic media to a digital signal. These input signals may be subject to a variety of magnetic and/or electrical anomalies that cause the received signal to vary from an ideal read signal. For example, various sources may cause variations in the direct current (DC) baseline, induce alternating current (AC) poles, and/or generate asymmetries in the input signal. These variations may cause baseline wander of the read signal and be a source of increased error in bit detection and decoding.

There is a need for technology that improves compensation for sources of baseline wander using existing read channel resources, such as the SOVA detector.

SUMMARY

Various aspects for signal correction using soft information in a read channel are disclosed, particularly use of a signal correction circuit that uses soft information from a soft output detector to determine a correction value for the read input signal.

One general aspect includes a read channel circuit that includes at least one soft output detector configured to: receive an input signal, detect data bits within the input signal, and output detected data bits and corresponding soft information. The circuit also includes a signal correction circuit configured to: receive the detected data bits and corresponding soft information; determine, based on the corresponding soft information, a signal correction value; and return a corrected signal to the at least one soft output detector.

Implementations may include one or more of the following features. The at least one soft output detector may include: a front-end soft output detector configured to receive the input signal from an analog front-end circuit; and an iterative soft output detector configured to receive the input signal from the front-end soft output detector and receive the input signal from a prior iteration of the iterative soft output detector. The signal correction circuit may be further configured to correct the input signal from the front-end soft output detector and the prior iteration of the iterative soft output detector. The iterative soft output detector is further configured to: selectively output the detected data bits and the corresponding soft information to an iterative decoder; and selectively receive decoder soft information from the iterative decoder. The signal correction circuit may include a switch configured to selectively receive the detected data bits and corresponding soft information from the front-end soft output detector and the iterative soft output detector. The signal correction circuit may include: an expectation signal generator configured to generate expected signal values based on the detected data bits; and a residue calculator configured to compare the expected signal values to the input signal to determine a residue term, where the signal correction value is based on the residue term. The signal correction circuit further may include a low confidence zeroing logic configured to: receive the corresponding soft information for a selected symbol in the detected data bits; compare the corresponding soft information for the selected symbol to a confidence threshold; and selectively zero out, based on the corresponding soft information for the selected symbol being below the confidence threshold, the residue term for the selected symbol. The signal correction circuit may further include: a residue aggregator configured to store a plurality of residue terms from the residue calculator and aggregate the plurality of residue terms to determine the signal correction value; and a signal correction logic configured to apply the signal correction value to the input signal to determine the corrected signal. The residue aggregator may be further configured to aggregate the plurality of residue terms over a moving window of symbols in the detected data bits by calculating a mean value of the plurality of residue terms in the moving window at a selected time. The expected signal values may include compensation values selected from direct current offset values, alternating current coupling pole compensation values, and signal asymmetry compensation values. A data storage device may include the read channel circuit.

Another general aspect includes a method that includes: receiving, in at least one soft output detector, an input signal; detecting, by the at least one soft output detector, data bits within the input signal; outputting, by the at least one soft output detector, detected data bits and corresponding soft information; receiving, by a signal correction circuit, the detected data bits and corresponding soft information; determining, by the signal correction circuit and based on the corresponding soft information, a signal correction value; and returning a corrected signal to the at least one soft output detector.

Implementations may include one or more of the following features. The method may include: processing the input signal through an analog front-end circuit, where a front-end soft output detector receives the input signal from the analog front-end circuit; correcting, using the signal correction circuit, the input signal to return a first corrected signal to an iterative soft output detector; processing, using the iterative soft output detector, the first corrected signal as the input signal for a first iteration of the iterative soft output detector; and correcting, using the signal correction circuit, the input signal to return a subsequent corrected signal for a next iteration of the iterative soft output detector. The method may include: selectively outputting, from the iterative soft output detector, the detected data bits and the corresponding soft information to an iterative decoder; and selectively receiving, in the iterative soft output detector, decoder soft information from the iterative decoder. The method may include switching a connection to the signal correction circuit between the front-end soft output detector and the iterative soft output detector to selectively receive the detected data bits and corresponding soft information from the front-end soft output detector and the iterative soft output detector. The method may include: generating, in the signal correction circuit, expected signal values based on the detected data bits; and comparing the expected signal values to the input signal to determine a residue term, where the signal correction value is based on the residue term. The method may include: determining the corresponding soft information for a selected symbol in the detected data bits; comparing the corresponding soft information for the selected symbol to a confidence threshold; and selectively zeroing out, based on the corresponding soft information for the selected symbol being below the confidence threshold, the residue term for the selected symbol. The method may include: storing a plurality of residue terms for a series of selected symbols; aggregating the plurality of residue terms to determine the signal correction value; and applying the signal correction value to the input signal to determine the corrected signal. The method may include: determining, for a selected symbol, a moving window of adjacent symbols in the detected data bits; and calculating, for the selected symbol, a mean value of the plurality of residue terms in the moving window to determine the signal correction value. The expected signal values may include compensation values selected from direct current offset values, alternating current coupling pole compensation values, and signal asymmetry compensation values.

Still another general aspect includes a system that includes means for detecting data bits within an input signal configured to: receive an input signal, detect data bits within the input signal, and output detected data bits and corresponding soft information. The system also includes means for correcting the input signal configured to: receive the detected data bits and corresponding soft information; determine, based on the corresponding soft information, a signal correction value; and return a corrected signal to the means for detecting data bits within the input signal.

The present disclosure describes various aspects of innovative technology capable of reducing baseline wander in read signals and improving error rates in data storage devices. The various embodiments include operations and control circuitry to overcome or at least reduce issues previously encountered in data storage devices and, accordingly, are more reliable and/or may support higher areal densities than other data storage devices. That is, the various embodiments disclosed herein include hardware and/or software with functionality to improve read operation processing and read channel performance, such as by using a signal correction circuit coupled to a soft output detector to use soft information to determine correction values for the read signal. Accordingly, the embodiments disclosed herein provide various improvements to read channel circuits, data storage devices, and computing systems incorporating such read channels.

BRIEF DESCRIPTION OF THE DRAWINGS

The techniques introduced herein are illustrated by way of example, and not by way of limitation, in the figures of the accompanying drawings in which like reference numerals are used to refer to similar elements.

DETAILED DESCRIPTION

Novel data processing technology, such as but not limited to systems, data storage devices, read channels, and methods for detecting, decoding, and/or recovering previously encoded data in a data channel, such as a data storage read channel using a signal correction based on soft information from a soft information detector (e.g., a soft output Viterbi algorithm (SOVA) detector), are disclosed. While this technology is described below in the context of a particular system architecture in various cases, it should be understood that the systems and methods can be applied to other architectures and organizations of hardware.

In some examples, the data channel technology may be applied to a data storage read channel for recovering encoded data from a non-volatile storage medium. For example, the read channel may be incorporated in a data storage device, such as a hard disk drive (HDD), a solid-state drive (SSD), a flash drive, an optical drive, a tape drive, etc. It is to be understood that the embodiments discussed herein may be applicable HDD and SSD, as well as a tape drive such as a tape embedded drive (TED) or an insertable tape media drive, such as those conforming to the LTO (Linear Tape Open) standards. An example TED is described in U.S. Pat. No. 10,991,390, issued Apr. 27, 2021, titled "Tape Embedded Drive," and assigned to the same assignee of this application, which is herein incorporated by reference. As such, any reference in the detailed description to an HDD or tape drive is merely for exemplification purposes and is not intended to limit the disclosure unless explicitly claimed. For example, references to disk media in an HDD embodiment are provided as examples only, and can be substituted with tape media in a tape drive embodiment. Furthermore, reference to or claims directed to magnetic recording devices or data storage devices are intended to include at least both HDD and tape drive unless HDD or tape drive devices are explicitly claimed.

Figure 1A:
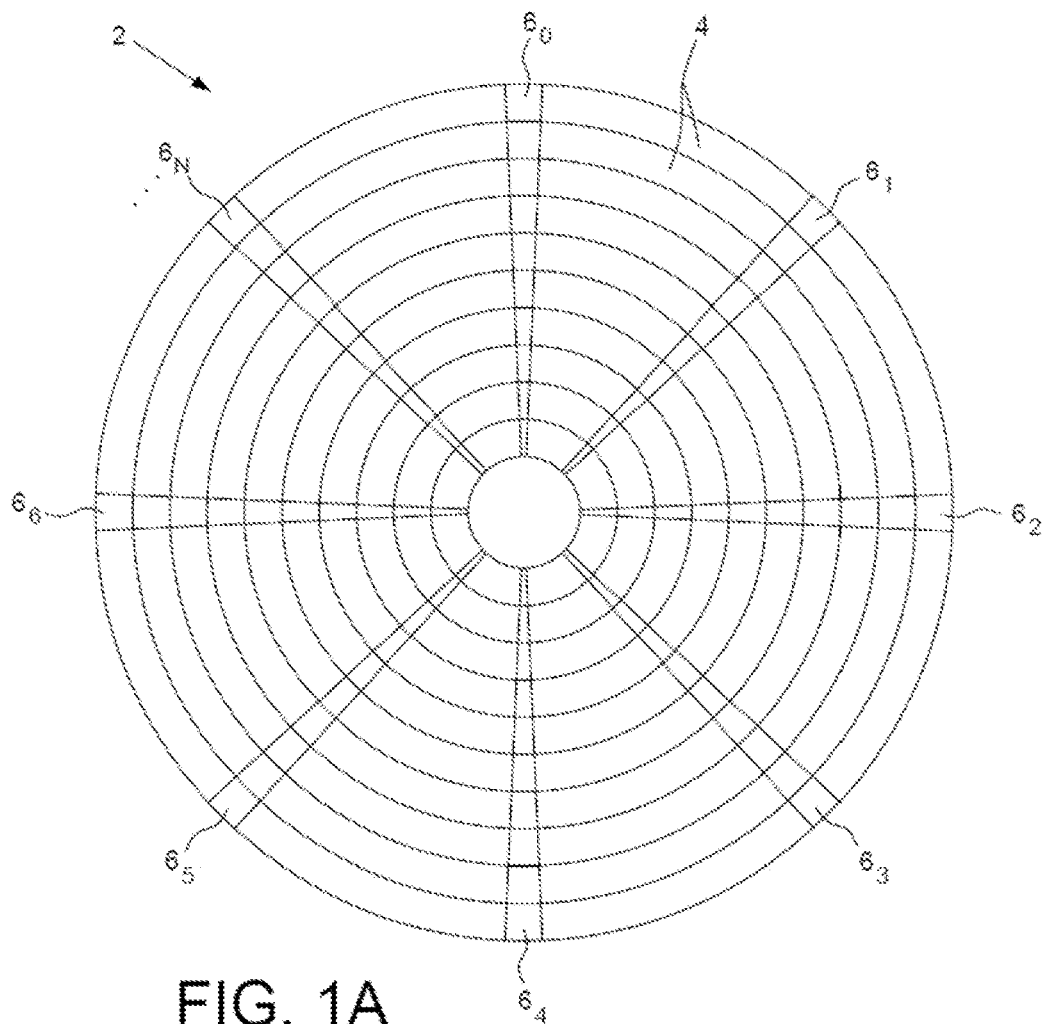
FIG. 1A is a block diagram of a prior art disk format comprising a plurality of servo tracks defined by servo sectors.
Figure 1B:
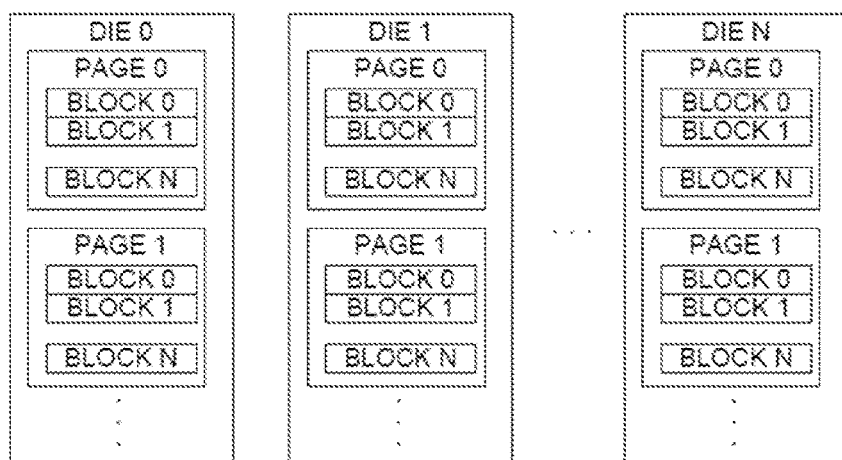
FIG. 1B is a block diagram of a prior art solid state drive format comprising a plurality of dies each comprising a plurality of pages.

FIG. 1A shows a prior art disk format 2 as comprising a number of servo tracks 4 defined by servo sectors $6_0$-$6_N$ recorded around the circumference of each servo track. Data tracks are defined relative to the servo tracks at the same or different radial density, wherein each data track comprises a plurality of data sectors. Each data sector may store the data symbols of a single codeword, or in other examples, each data sector may store symbols from multiple codewords (i.e., interleaved codewords). FIG. 1B shows a prior art die format for a solid state drive, wherein each die may store multiple pages and each page may store multiple blocks each corresponding to a data sector or other data unit of encoded binary data of a disk drive.

In data storage devices incorporating non-volatile storage media, such as the disk of FIG. 1A, the non-volatile memory devices of FIG. 1B, or magnetic tape in a TED or other tape drive such as LTO, an analog read signal from the storage media may be converted into a digital bit stream by an analog-to-digital-converter (ADC) and passed to the read channel for further processing. In some examples, bit data values may be stored to a non-volatile storage medium as data blocks or other data units using one or more encoding schemes. These bit data values may be processed from the digital bit stream in windows of multiple adjacent bits and a set of adjacent bits, such as 2, 3, 5, 7, or more continuous bits from the bit stream, may be processed as a symbol for data detection and/or decoding purposes. One or more symbols may, in turn, make up one or more codewords, such as codewords selected and encoded in accordance with an error detection and/or correction scheme, such as low-density parity check (LDPC) codes. These encoded codewords may be decoded to determine decoded bit values. In some examples, the decoded bit values from these codewords may still be subject to further decoding, such as run-length limited (RLL) decoding and/or descrambling to arrive that the output data. While the description below refers to non-volatile storage medium/media (NVSM) examples, the various examples disclosed could be applied to process data read from volatile medium/media as well, as well as data signals transmitted through and/or received from a wired, wireless, or other transmission medium.

Modern HDDs use perpendicular recording technology to store data bits in the magnetic storage media, such as the disk of FIG. 1A, with increasing bit density. The system may be architected as though the spectral content of the read signal extends to direct current. However, there may exist several very low frequency AC poles that prevent the read channel from passing information close to DC. This may result in baseline wander of the read signal, which degrades bit detection performance. For example, an AC pole may be created by the magnetic return path associated with perpendicular heads and media. The field of each perpendicular bit may induce magnetic flux in the soft underlayer of the perpendicular recording media that is detected by the read head. A long negative signal tail may be picked up by the read sensor leading and lagging each bit written. Superposition applies and such signals may be magnified by strings of bits having the same value. The magnetic AC pole from the soft underlayer may behave like a linear phase null at DC. Some HDD configurations have placed compensation circuits of various designs, such as DC restore circuits, within the analog front-end of the read channel, sometimes receiving a binary input from the detector indicating the believed bit value.

Figure 2:
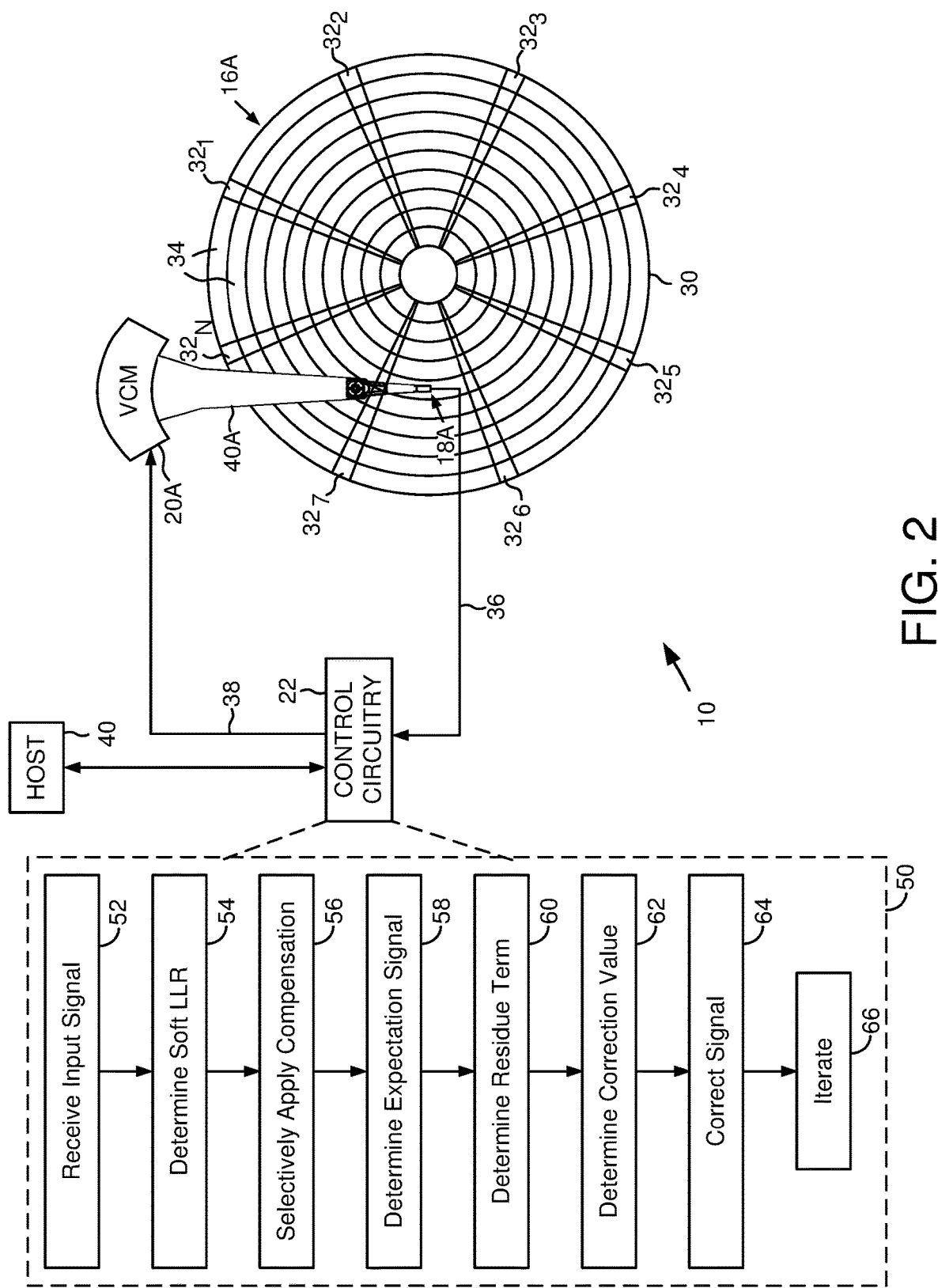
FIG. 2 is a diagram of an example data storage device in the form of a disk drive comprising a head actuated over a disk surface and related read channel control circuitry.

FIG. 2 shows a data storage device in the form of a disk drive according to an embodiment comprising a disk 30 having at least one disk surface 16A and at least one head 18A actuated over disk surface 16A by a first actuator 20A. While a single disk, head, and actuator are shown, multiple disks, heads, and/or actuators may be present in other configurations.

Disk drive 10 further comprises control circuitry 22 configured to execute flow diagram 50 for correcting read signals based on soft log likelihood ratios (LLR) or other soft information. For example, disk drive 10 may include on-board electronics comprising one or more systems on a chip (SOC), application-specific integrated circuits (ASICs), and/or other data or signal processing components attached to a printed circuit board assembly (PCBA) and/or other interconnects (such as the flex connector to the actuators). Control circuitry 22 may include circuits, processors, memory devices, and software or firmware executed therein for completing various data and signal processing tasks, including control of actuator 20A and read-write operations through head 18A. In some embodiments, control circuitry 22 may include distinct servo control and read/write channel paths for each actuator and their respective disk surfaces (and data written thereon).

In FIG. 2, each disk surface (e.g., 16A) comprises a plurality of servo sectors $32_1$-$32_N$ that define a plurality of servo tracks 34, wherein data tracks are defined relative to the servo tracks at the same or different radial density. Control circuitry 22 processes a read signal 36 emanating from the head to demodulate the servo sectors and generate a position error signal (PES) representing an error between the actual position of the head and a target position relative to a target track. A servo control system in control circuitry 22 filters the PES using a suitable compensation filter to generate a control signal 38 applied to a coarse actuator (e.g., voice coil motor (VCM) actuator 20A) which rotates an actuator arm (e.g., 40A) about a pivot in order to actuate the corresponding heads radially over the disk surfaces in a direction that reduces the PES. The heads may also be servoed using a fine actuator, such as a piezoelectric (PZT) actuator, configured to actuate a suspension relative to the actuator arm, and/or configured to actuate the head relative to the suspension. Servo sectors $32_1$-$32_N$ may comprise any suitable head position information, such as a track address for coarse positioning and servo bursts for fine positioning. The servo bursts may comprise any suitable pattern, such as an amplitude-based servo pattern or a phase-based servo pattern.

A host 40 is a computer system or other external system or device to which disk drive 10 is coupled and/or integrated. The storage medium (e.g., disk 30) is accessible for data storage and I/O (input/output) operations. For instance, host 40 may issue commands for data manipulation in the storage medium. Control circuitry 22 mediates the communication between host 40 and the storage medium and provides an interface between the storage medium and a bus connecting it to the rest of the system. For example, control circuitry 22 may be a drive or memory controller of a data storage device that receives host storage commands and returns responses, including host data written to and read from disk 30. Control circuitry 22 may include data write channel circuitry for data writing execution and data read channel circuitry for data reading execution.

When reading data from disk 30, control circuitry 22 may receive a command signal from host 40, which instructs control circuitry 22 to access a certain portion of disk 10 (e.g., the locations of blocks on disk surface 16A corresponding to a data unit) to be accessed. As a further example, in response to the command signal, servo electronics within the control circuitry 22 may produce control signals that position head 18A over a desired track (e.g., tracks 34) in disk drive 10, which develops read signal 36 indicative of flux reversals in the track over which head 18A is positioned. Control circuitry 22 may include a read channel configured to detect and decode host data from read signal 36. Control circuitry 22 may then manipulate and/or return the host data to host 40.

Control circuitry 22 may include hardware and firmware configured to execute an example method for signal correction using soft information in the read channel, such as flow diagram 50. In some embodiments. control circuitry 22 may incorporate hardware and/or software elements similar to those shown and described for FIG. 3 below for executing flow diagram 50. For example, control circuitry 22 may incorporate a SOVA detector coupled to a signal detection circuit for correcting the read signal between global iterations of the SOVA detector. The resulting corrected signal may improve the reliability and efficiency of the read channel for correctly detecting and decoding host data stored to disk 30.

At block 52, an input signal may be received. For example, read signal 36 may be processed through an analog front-end, including an analog-digital converter (ADC) and an equalizer to provide an input signal to a SOVA detector.

At block 54, soft information, such as soft LLR values corresponding to each detected bit, may be determined. For example, the SOVA detector may apply a Viterbi algorithm to detect the most likely bit states in each bit position in the input signal.

At block 56, signal compensation may be selectively applied based on the soft LLR value. For example, a signal correction circuit may use a confidence threshold based on the LLR value for a given bit to determine whether that signal data related to that bit should be used for determining a correction value. Low-confidence bits may otherwise introduce noise into the determination of the correction values.

At block 58, an expectation signal may be determined. For example, the signal correction circuit may be configured with an ideal signal value or set of signal values for the data bits (1 s and 0 s).

At block 60, a residue term may be determined. For example, the signal correction circuit may compare the expectation signal to the input signal for a detected bit or symbol and determine a residue term for the bit or symbol based on the difference.

At block 62, a correction value may be determined from one or more residue terms. For example, a plurality of residue terms may be averaged to determine an appropriate correction signal, while the residue values for low-confidence bits or symbols determined at block 56 may be excluded from the calculation of the correction value.

At block 64, the correction value may be applied to the input signal to correct the signal values. For example, the correction value may be added to the input signal before being provided for the next iteration of the SOVA detector.

At block 66, the SOVA detector iterates and may execute flow diagram 50 between each iteration to improve the error correction. For example, each pass through the SOVA detector may change the bit determinations and corresponding soft LLR values and the signal correction circuit may adjust the correction values according to the new information. In some configurations, global iterations may pass the bit information and soft information from the SOVA detector to an iterative decoder, such as a low-density parity-check code (LDPC) decoder, between iterations and may receive soft information from the LDPC decoder to further influence the next determination of bit values and LLR values (and resulting correction values).

Figure 3:
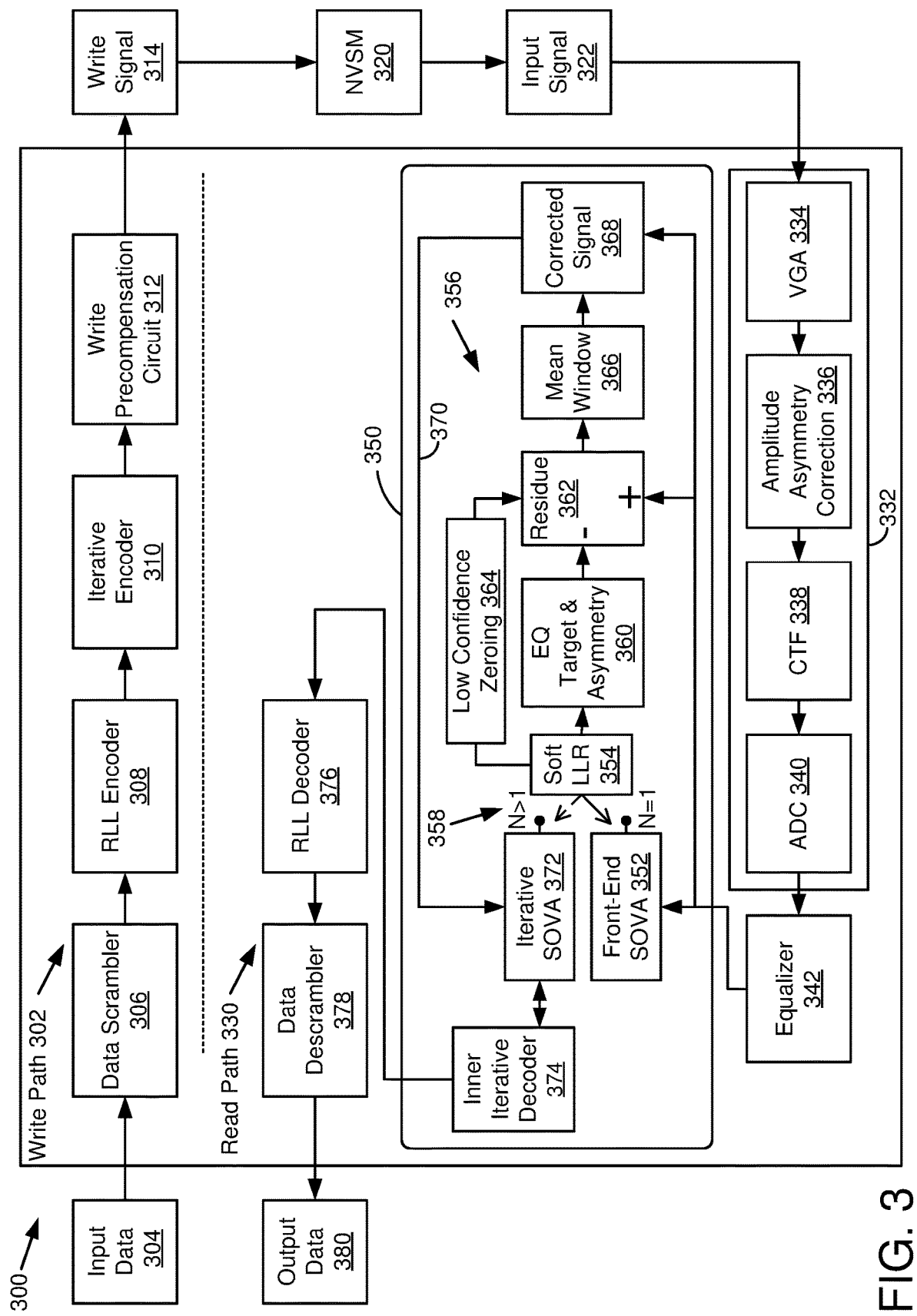
FIG. 3 is a block diagram of an example data storage system including various data processing components.

FIG. 3 is a block diagram illustrating control circuitry 300 comprising components employed in a read/write path of a storage system, such as the read/write channel of a data storage device. As illustrated, the write path 302 includes a data scrambler 306, an RLL encoder 308, an iterative encoder 310, and a write precompensation circuit 312. A write signal 314 may be output by the write path in some examples to store the resulting write bit stream to NVSM 320. Similarly, an input signal 322 may be read from NVSM 320 for processing through a read path 330. Read path 330 includes a variable gain amplifier (VGA) 334, an amplitude asymmetry correction (AAC) component 336, a continuous time filter (CTF) 338, an ADC 340, an equalizer 342, an iterative decoder 350, a RLL decoder 376, and a data descrambler 378. These component(s) receive input signals 322 as an analog read signal, and process, decode, and output the signals as output data 380, which may include decoded binary data units, such as data blocks. In some examples, these component(s) of read path 330 may comprise a read channel device or circuit.

Data scrambler 306 "randomizes" input data 304 ("whitens" the input sequence of the data) to be written into a storage media. In general, a storage system has no control over the data the user is going to write. This causes problems because it violates the assumptions that are usually made when designing storage systems, such as having independent data symbols. Since the data are not random, a frequently occurring problem is long strings of zeros in the data, which can cause difficulties in later timing recovery and adaptive equalization. These problematic sequences can be removed (or, actually, made much less likely) by introducing randomization of the input sequence for the input data 304. Therefore, during the data writing process, input data 304 may be first randomized by data scrambler 306.

RLL encoder 308 modulates the length of stretches in the randomized data. RLL encoder 308 employs a line coding technique that processes arbitrary data with bandwidth limits. Specifically, RLL encoder 308 can bound the length of stretches of repeated bits so that the stretches are not too long or too short. By modulating the data, RLL encoder 308 can reduce the timing uncertainty in later decoding of the stored data, which could lead to the possible erroneous insertion of bits when reading the data back, and thus ensure the boundaries between bits can more reliably be found.

Iterative encoder 310 can append one or more parity bits to the modulated block code for later detection whether certain errors occur during data reading process. For instance, an additional binary bit (a parity bit) may be added to a string of binary bits that are moved together to ensure that the total number of "1"s in the string is even or odd. The parity bits may thus exist in two different types, an even parity in which a parity bit value is set to make the total number of "1"s in the string of bits (including the parity bit) to be an even number, and an odd parity in which a parity bit is set to make the total number of "1"s in the string of bits (including the parity bit) to be an odd number. In some examples, iterative encoder 310 may implement a linear error correcting code, such as LDPC codes or other turbo codes, to generate codewords that may be written to and more reliably recovered from NVSM 320. In some examples, iterative encoder 310 may further implement one or more single parity check codes within the codeword for recovery using soft information decoding, such as SOVA, Bahl, Cocke, Jelinek, Raviv (BCJR), or other single parity check code decoding techniques. Iterative encoder 310 may implement iterative encoding techniques to reuse the decoder architecture (components of iterative decoder 350), thereby reducing circuit space.

Write precompensation circuit 312 can alleviate the effect of nonlinearities in the writing process. Major causes of the nonlinearities during data writing include bandwidth limitations in the write path and the demagnetizing fields in the magnetic medium for magnetic disks. These nonlinearities can cause data pattern-dependent displacements of recorded transitions relative to their nominal positions. The write precompensation circuit 312 can compensate for these data pattern-dependent displacements by introducing data pattern-dependent compensating shifts into the signals. After compensation, the information may then be written as non-return to zero (NRZ) data.

In an HDD embodiment, when reading data back from the NVSM 320, the data head of the disk drive senses the transitions (changes) in the storage medium and converts the information back into an electronic waveform. Reading analog input signal 322 from a storage medium starts at the storage medium (e.g., the drive's storage platter) and head transducer (see FIG. 2). The head transducer is located prior to the analog front-end circuit 332 in the data read path and the head transducer output is driven by the data pattern previously written on the rotating disk. After converting into an electronic waveform, the head transducer output (e.g., input signal 322) may be further processed by the components illustrated in FIG. 3 in the read path 330 for data detection, decoding, and descrambling.

VGA 334 amplifies the analog signal read back from the storage medium. VGA 334 controls a signal level of the read-back analog signal based on a gain determined by an automatic gain control loop. One main function of the automatic gain control loop is to control an input signal level for optimum performance in the ADC 340. Too much gain from VGA 334 can cause sample values in ADC 340 to rail at maximum or minimum ADC levels, while too little gain can cause quantization noise to dominate the signal-to-noise ratio (SNR) and thus adversely affect bit error rate performance.

AAC 336 and CTF 338 work to linearize the amplified analog signal prior to feeding it to ADC 340. In an HDD embodiment, AAC 336 works to reconstruct linearity that may have been lost in the head transducer stage when the information on the storage disk is converted into an electronic signal at the output of the data head. The biasing of the head signal may in some cases be adjusted to keep the signal in the linear range of the head sensitivity curve. However, if the signal amplitude changes due to fly height or disk variation exceed the head transducer linear range, saturation in the peak or trough of the electrical head signal can occur. AAC 336 may use signal offset to determine the amount of squared signal to add back to restore the positive and negative symmetry of the signal.

It should be noted that in practice, the read back analog signals from many different commonly used heads in existing devices cannot be linearized, regardless of the kind of biasing approach that is employed. Thus, improving data detection and recovery technology in the read channel can advantageously handle the read back signals from these types of heads because it may better compensate for non-linear responses from the read heads.

CTF 338 provides mid-band peaking to help attenuate high-frequency noise and minimize any aliasing that may occur when the analog signal is converted to a sampled representation. In an HDD embodiment, aliasing may not have a large effect on a drive surface's bit error rate performance. However, it can have an impact on disk drive manufacturing yields. CTF 338 is typically a multiple pole low pass filter (e.g., a four pole Butterworth filter) with a zero available for mid-band peaking. Signal peaking can be used to emphasize frequency components, which are useful in shaping the signal to meet the digital target signal characteristic. Besides anti-aliasing, CTF 338 may also partially equalize the data.

ADC 340 can convert an analog signal (e.g., input signal 322), as input and/or processed by upstream components, to digital samples quantized in time and amplitude. The clock used may include the output of a digital phase-locked loop, which tracks the channel rate clock frequency. The output of ADC 340 may be used as feedback to control the timing of the digital phase-locked loop as well as the automatic gain control, DC baseline correction, and equalization. VGA 334, CTF 338, and ADC 340, with or without AAC 336, together may be called an analog front-end 332, as the signals processed in these components are analog, while the signals in the remaining downstream components of read path 330 may be digital, although other variations of analog front-end 332 (which may be considered as one example form of an analog to digital convertor) may comprise software and/or hardware elements configured to convert signals from analog to digital and/or include other components for filtering, tuning, and/or processing data. In an HDD embodiment, the read channel analog front-end functions are generally similar regardless of whether the data is recorded using perpendicular or horizontal techniques.

Equalizer 342 is used for compensating for channel distortion. For example, an FIR filter may perform filtering to provide additional equalization of the signal to match signal characteristic to the desired target response for bit detection. Some equalizers may also include a noise whitening filter that further equalizes the spectrum of the signal from the FIR samples to remove noise that has a non-flat amplitude spectrum. For example, the noise whitening filter may enhance low-level spectral components and attenuate high-level ones. At the output of equalizer 342, the signal is now in a fully digital form and ready for detection of the encoded bits. The digital sample stream is submitted as an input signal to the sequence detector (e.g., iterative decoder 350) to begin decoding in trellises for bit recovery.

Iterative decoder 350 may include an iterative inner decoder 374 and one or more SOVA detectors (sometimes considered a SOVA detector with multiple stages), such as front-end SOVA 352 and iterative SOVA 372. In the example shown, front-end SOVA 352 receives the digital input signal from analog front-end 332 through equalizer 342. Front-end SOVA 352 may be configured to handle a first pass (N=1) bit detection and iterative SOVA 372 may be configured to handle each additional pass (N>1) for the same sample, symbol, or codeword. Both front-end SOVA 352 and iterative SOVA 352 may output detected bits (sampled in bits, symbols, or codewords) and corresponding soft information, such as soft LLR values 354, for each detected bit. The SOVA detector(s) may output the bit detection data and corresponding soft information to a next stage or iteration of the SOVA detector, inner iterative decoder 374 and/or to a signal correction circuit 356.

The SOVA detectors may use a Viterbi-like algorithm to decode a bit stream for bit recovery. The SOVA detectors may include a variant of the classical Viterbi algorithm. It may differ from the classical Viterbi algorithm in that it uses a modified path metric which takes into account a priori probabilities of the input symbols, and produces a soft output indicating the reliability of the decision. The SOVA detectors operate by constructing a trellis of state of probabilities and branch metrics. In some examples, the SOVA detectors may be configured to detect the probabilities of bit values based on single parity check codes. Once the bit recovery is completed, parity post-processing can be performed. In some examples, an initial set of bit probabilities may be provided to inner iterative decoder 374 for parity-based decoding of the codeword, initiating iterative bit detection by iterative SOVA 372 and parity determination by inner iterative decoder 374 with the two components exchanging sets of bit probabilities as extrinsic information for reaching their maximum likelihood results and returning a decoding decision. Each time soft information is passed from iterative SOVA 372 to inner iterative decoder 374 and back to iterative SOVA 372 may be considered a global iteration of iterative decoder 350, since both the SOVA detector and inner iterative decoder 374 may also perform internal iterations where data is not passed between them.

Signal correction circuit 356 may be coupled to the SOVA detector for performing signal corrections between iterations of the SOVA detector. Signal correction circuit 356 may comprise a plurality of components that may be embodied in hardware, software, firmware, and/or a combination thereof. In some embodiments, each component may correspond to a portion of signal correction circuit 356 including a plurality of hardware logic features and/or corresponding data registers. Components may include shared or overlapping hardware logic features and/or data registers. In the example shown, signal correction circuit 356 includes equalization target & asymmetry correction component 360, residue component 362, low confidence zeroing component 364, mean window component 366, and corrected signal component 368.

In the example shown, the SOVA detector includes two stages, front-end SOVA 352 and iterative SOVA 372, and signal correction circuit 356 is selectively coupled to front-end SOVA 352 and iterative SOVA 372 by a switch 358. Through switch 358, front-end SOVA 352 and iterative SOVA 372 may receive soft information, such as soft LLR 354, from the respective SOVA detectors. When an input signal is received by front-end SOVA 352, switch 358 may couple front-end SOVA 352 to signal correction circuit 356 for a first iteration of the SOVA detector (N=1) and send the soft information resulting from the first iteration to signal correction circuit 356. Signal correction circuit 356 may return corrected signal 370 to iterative SOVA 372. For additional iterations of the SOVA detector (N>1) switch 358 may switch the input coupling to signal correction circuit 356 from front-end SOVA 352 to iterative SOVA 372. In alternate configurations, signal correction circuit 356 may be disposed linearly between front-end SOVA 352 and iterative SOVA 372 and/or may be a signal correction loop coupled to a single stage SOVA detector (which combines handling of both the N=1 and N>1 iterations in the same SOVA detector).

Signal correction circuit 356 may include equalization target and asymmetry correction component 360 (sometimes referred to as expectation signal component 360). Expectation signal component 360 may be configured to store, access, or otherwise determine expectation signal values for the possible bit or symbol states. For example, the expectation signal values may correspond to ideal wave forms for digital signals and corresponding transitions to be detected by the SOVA detectors. In some embodiments, the expectation signal values may be determined and/or stored using a circuit or set of values in a lookup table. For example, a set of equalization target values may be determined for a set of bit times, such as three consecutive bit times 0, 1, and 2. The equalization target may be configured with three time-based constants $[T_0, T_1, T_2]$, such as 4, 7, 1. The believed data values output by the SOVA detectors may include a sign (+1 or −1, indicating whether the bit value is believed to be a 1 or 0) and be represented by a at different bit times, such as $a_k$, $a_{k-1}$, and $a_{k-2}$. The linear expectation value for a current bit may be determined by $(a_k*T_0)+(a_{k-1}*T_1)+(a_{k-2}*T_2)$. Similarly, a confidence value for the bit may be based on comparing the LLR confidence (magnitude) value to a confidence threshold for each bit in the series, selecting a 1 for values meeting the confidence threshold and a 0 for values not meeting the confidence threshold, then evaluating the bit confidence indicators across the set of bit times for a cumulative confidence indicator. A lookup table may simply be indexed by the combination of the expectation signal values across the set of bit times and provide corresponding expectation values based on an ideal expectation (similar to the described circuit), or based on a set of values from a different model, such as a non-linear or experimental model.

In some embodiments, expectation signal component 360 may include signal values that include both an equalization target for each sample and asymmetry correction for that sample. Expectation signal component 360 may receive soft LLR values 354 (and/or bit detection values and other soft information) from the SOVA detectors and use soft LLR values 354 to determine the equalization target and/or asymmetry correction values to use for the sample being processed. For example, soft LLR values indicating a most likely bit value of 1 may use a first set of expectation signal values for the sample and a most likely bit value of 0 may use a second set of expectation signal values. In some embodiments, the determination of the expectation signal values may be based on an alternate sample size, such as a symbol including more than one bit. In some embodiments, the expectation signal values may include compensation components that address specific phenomena within the read channel. For example, the expectation signal values may include one or more of a DC offset compensation value, an AC coupling pole compensation value, and/or a signal asymmetry compensation value. Expectation signal component 360 may pass the determined expectation signal to residue component 362.

Residue component 362 may be configured as a residue calculator to compare the expectation signal to the actual input signal to determine a difference or residue term for the sample. For example, residue component 362 may comprise a comparator that subtracts the expectation signal values for the sample from the corresponding input signal values from analog front-end 332 (and/or equalizer 342). For each sample set of signal values, a residue term may be determined and passed to mean window component 366. In some embodiments, low confidence zeroing component 364 may further regulate the residue terms that are passed to mean window component 366. For example, low confidence zeroing component 364 may include logic for comparing soft LLR 354 to a confidence threshold configured to prevent low confidence samples (and corresponding residue terms) from biasing or creating noise in the signal correction. Low confidence zeroing component 364 may receive soft LLR values 354 (or other soft information) from the SOVA detector and include logic for determine whether or not to include the residue term for a particular sample based on soft LLR values 354. Low confidence zeroing component 364 may include a configurable confidence threshold that determines a required LLR value for a bit sample to be included in the correction signal calculation. For example, a sample corresponding to a 1 bit value must meet (equal or exceed) the confidence threshold and, if it does not, low confidence zeroing component 364 may zero out the residue term for that sample, changing the residue value to 0, such that it will not impact subsequent calculations of a correction value for corrected signal 370. In some embodiments, low confidence zeroing component 364 may store confidence thresholds in a configurable register or other data structure and may include multiple confidence thresholds, such as different confidence thresholds for 1 and 0 bit values.

Mean window component 366 may be configured as a residue aggregator for aggregating residue terms from residue component 362 to calculate signal correction values based on a series of adjacent symbols. For example, mean window component 366 may determine a moving window of samples, store the corresponding residue terms, and calculate an average residue value as the signal correction value applied to the input signal. Mean window component 366 may include a configurable window size value corresponding to the number of samples or bits used to calculate the signal correction value. For example, mean window component 366 may be configured to aggregate residue terms for a moving window of 10, 50, 200, or 1000 bits or samples. In some embodiments, mean window component 366 may include a set of registers or other data structure for storing residue terms as they are generated by residue component 362. For example, mean window component 366 may include a circular register with a number of storage locations corresponding to the window size value. Mean window component 366 may use the aggregate residue values to calculate a correction value to be applied to the input signal. In some embodiments, mean window component 366 may calculate an average or mean of a set of residue terms to determine the correction value to be applied to a particular sample value in the input data stream. Other configurations for calculating a correction value from the set of residue terms are possible. Mean window component 366 may pass calculated correction values to corrected signal component 368.

Corrected signal component 368 may include signal correction logic for receiving correction values from mean window component 366 and the input signal from analog front-end 332 (and/or equalizer 342) to generate corrected signal 370. For example, correction values from mean window component 366 may be applied to the original input signal to modify input signal values on a bit or sample basis with a corresponding correction value determined by the other components of signal correction circuit 356. Corrected signal component 368 may pass corrected signal 370 back to the SOVA detector for signal correction circuit 356. For example, corrected signal 370 may be directed back to iterative SOVA 372 for use in the next iteration of bit detection by iterative SOVA 374. This process of iterative signal correction may be repeated on subsequent corrected signals for each iteration.

Inner iterative decoder 374 may help to ensure that the states at the parity block boundary satisfy the parity constraint by conducting parity error checking to determine whether data has been lost or written over during data read/write processes. It may check the parity bits appended by iterative encoder 310 during the data writing process, and compare them with the bits recovered by the SOVA detector. Based on the settings of iterative encoder 310 in the data writing process, each string of recovered bits may be checked to see if the "1"s total to an even or odd number for the even parity or odd parity, respectively. A parity-based post processor may also be employed to correct a specified number of the most likely error events at the output of the Viterbi-like detectors by exploiting the parity information in the coming sequence. Iterative SOVA 372 and the inner iterative decoder 374 together may be referred to as an iterative decoder 350, as iterative decoding may exist between the two components. For example, iterative SOVA 372 may pass detected sets of bit probabilities (e.g., soft LLR 354) to inner iterative decoder 374 and inner iterative decoder 374 may use those bit probabilities to determine a most likely codeword match. If decode decision parameters are not met, inner iterative decoder 374 may feedback soft information for the set of bit probabilities to iterative SOVA 372 as extrinsic information for further iterations of the SOVA bit detector and iterative SOVA 372 may feed forward a new set of bit probabilities for each iteration to inner iterative decoder 374. In addition to the extrinsic information from inner iterative decoder 374, iterative SOVA 372 may also use corrected signal 370 from the most recent prior iteration to determine the new set of bit probability values. When decode decision parameters are met, the codeword may be decoded into a set of decoded bit values for output or further processing by RLL decoder 376 and data descrambler 378.

RLL decoder 376 may decode the run length limited codes encoded by the RLL encoder 308 during the data writing process, and the data descrambler 378 may descramble the resulting sequence, which eventually can reveal the original user data written into the storage media. The recovered or read data, output data 380, may then be sent to a requesting device, such as a host computer, network node, etc., in response to receiving the request for the data.

Figure 4:
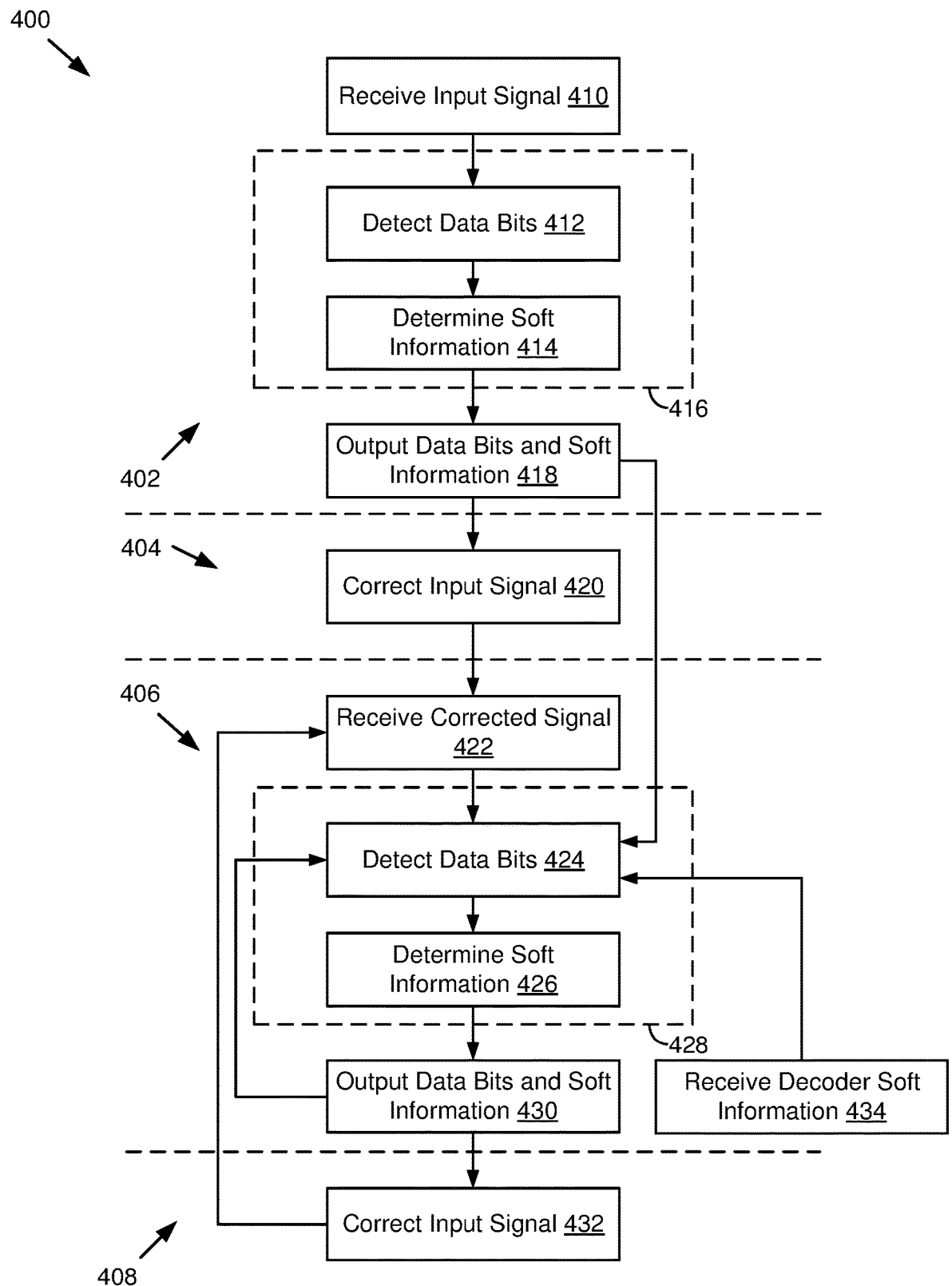
FIG. 4 is an example method of correcting read signals using soft information between detector stages and/or iterations.

As shown in FIG. 4, control circuitry 300 may be operated according to an example method of correcting the read signal in a read channel using soft information from a SOVA detector in the channel, i.e., according to the method 400 illustrated by blocks 410-434. In some configurations, blocks 410-418 may be executed by a first stage or iteration 402 of a SOVA detector, blocks 420 and 432 may be executed by a signal correction circuit process 404 and 408, and blocks 422-430 may be executed by a second stage or next iteration 406 of the SOVA detector.

At block 410, an input signal may be received by a read channel. For example, a SOVA detector may receive a digital read signal from an analog front-end of the read channel.

At block 412, data bits may be detected. For example, the SOVA detector may use a Viterbi-like algorithm and corresponding trellis structure to determine the most likely data bit value or values for a digital sample from the input signal.

At block 414, soft information may be determined. For example, the SOVA detector may also calculate a soft LLR value for each detected bit or symbol. Blocks 412 and 414 may be collectively referred to as bit detection 416 and output bit values and corresponding soft information at block 418 for each bit or sample in the input signal data stream.

At block 420, the input signal may be corrected. For example, a signal correction circuit may use the bit values and corresponding soft information from the SOVA detector to calculate a correction value applied to the input signal.

At block 422, a corrected signal may be received by the SOVA detector. For example, the signal correction circuit may return a corrected signal for the input signal data stream to the SOVA detector for use in a next iteration.

At block 424, data bits may be detected. For example, the SOVA detector may use the Viterbi-like algorithm and corresponding trellis structure to determine the most likely data bit value or values for each sample in the corrected input signal.

At block 426, soft information may be determined. For example, the SOVA detector may also calculate the soft LLR value for each detected bit or symbol in the corrected input signal. Blocks 424 and 426 may be collectively referred to as a next or subsequent bit detection 428 relative to bit detection 416 and output bit values and corresponding soft information at block 430 for each bit or sample in the corrected signal data stream.

At block 432, the input signal may be corrected again. For example, the signal correction circuit may use the updated bit values and corresponding soft information from the subsequent bit detection 428 of the SOVA detector to calculate an updated correction value and apply it to the input signal. This cycle of receiving corrected signals and generating a new corrected signal based on updated bit detection information may be repeated for any number of iterations, such as each iteration of the SOVA detector and/or each global iteration of an iterative decoder the SOVA detector is disposed. For global iterations, decoder soft information may be received at block 434 and used as extrinsic information for bit detection 428. For example, an inner iterative decoder may pass soft information to the SOVA detector for each global iteration.

Figure 5:
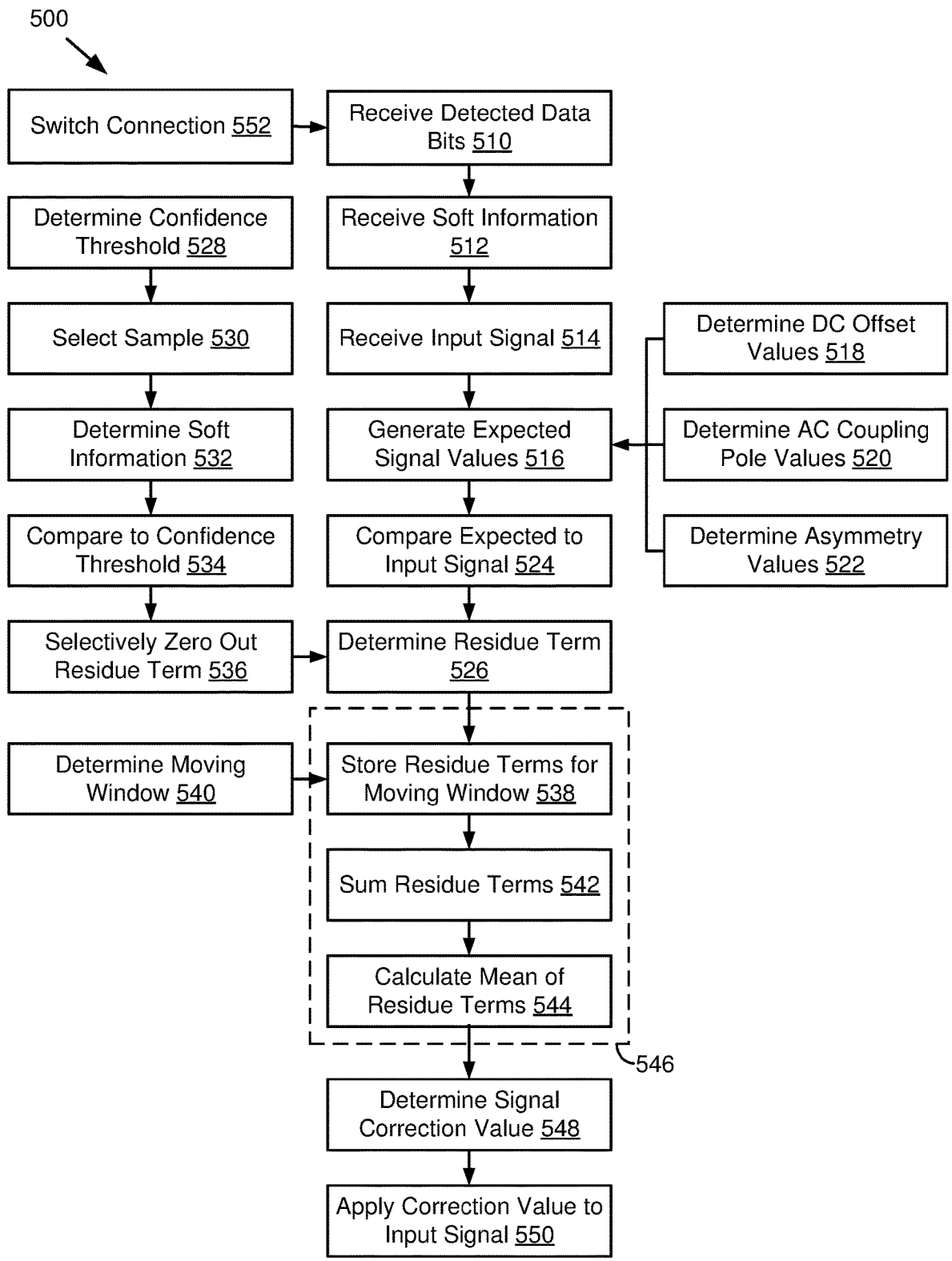
FIG. 5 is an example method of determining a corrected read signal using soft information from a soft information detector.

As shown in FIG. 5, control circuitry 300 may be operated according to an example method of correcting an input signal using a signal correction circuit based on SOVA bit detection data, i.e., according to the method 500 illustrated by blocks 510-552.

At block 510, detected data bits may be received. For example, a signal correction circuit may be coupled to a SOVA detector to receive the data bits detected from an input signal.

At block 512, soft information may be received. For example, the signal correction circuit may also receive soft information, such as soft LLR values, along with the detected data bits from the SOVA detector.

At block 514, the input signal may be received by the signal correction circuit. For example, the signal correction circuit may receive the input signal from the analog front-end of the read channel circuit.

At block 516, expected signal values may be generated. For example, based on the detected data bits and/or the corresponding soft information, the signal correction circuit may determine ideal signal values for the samples from the input signal being processed. In some embodiments, the expected signal values may be configured to compensate for one or more features of the input signal. For example, at block 518, DC offset values may be determined, at block 520, AC coupling pole values may be determined, and/or, at block 522, asymmetry values may be determined. The expected signal values may include one or more of a DC offset compensation value, an AC coupling pole compensation value, and/or a signal asymmetry compensation value. The expected signal values may be configured based on testing or modeling of the read channel or similar read channels prior to configuration of an expectation signal generator to address compensation for one or more of the signal features. The compensation may help to reduce baseline wander in the read channel. For example, in the presence of an AC coupling pole, the actual read signal value may shift and the expected signal value may be determined to identify that shift for correction by the signal correction circuit.

At block 524, the expected signal values may be compared to corresponding actual signal values in the input signal. For example, the signal correction circuit may include a comparator that subtracts the expected signal values from the input signal values.

At block 526, the residue term for a sample may be determined. For example, the signal correction circuit may use the value from the comparator as a residue term. In some embodiments, the value from the comparator may be selectively zeroed out based on the operation of blocks 528-536. The residue term may represent a difference between the expected signal and actual signal that is indicative of one or more of the signal features that the signal correction circuit is configured to address.

At block 528, a confidence threshold may be determined. For example, the signal correction circuit may be configured with a confidence threshold for excluding residue terms from bit values with relatively low confidence values.

At block 530, a sample may be selected. For example, the signal correction circuit may process residue terms and related confidence decisions on a symbol basis, where a symbol corresponds to one or more bit values.

At block 532, soft information may be determined. For example, the signal correction circuit may use the soft information received at block 512 for the sample being processed.

At block 534, the soft information may be compared to the confidence threshold. For example, the signal correction circuit may compare the soft information corresponding to the bit or bits in the sample to the configured confidence threshold to determine whether the confidence threshold is met.

At block 536, the residue term may be selectively zeroed out. For example, the signal correction circuit may, based on the confidence threshold not being met, reduce the residue term calculated by the comparison at block 524 to a zero value, replacing the calculated value with a 0 value at block 526. This may allow the signal correction circuit to avoid introducing noise from samples with low confidence values that may otherwise cause the compensation values to overshoot or undershoot the desired correction.

At block 538, residue terms may be stored for a moving window of samples. For example, the signal correction circuit may store a number of residue terms for consecutive samples in a series of registers or other data storage locations. The number of residue terms to be stored may be based on a moving window value determined at block 540. For example, the signal correction circuit may be configured with a moving window value corresponding to the number of residue terms for adjacent symbols to be aggregated. Because distortions caused by undesirable signal features may be cumulative and otherwise cause the baseline signal values to wander, aggregating and averaging the resulting residue terms across multiple samples may both improve the overall accuracy of the compensation values and prevent excessive sample-to-sample variations.

At block 542, residue terms may be summed. For example, the signal correction circuit may sum the residue values in the number of samples in the current moving window relative to the sample being processed.

At block 544, a mean value of the summed residue terms may be calculated. For example, the signal correction circuit may average the residue values by dividing the sum of the residue terms by the number of samples in the moving window. The combination of storing, summing, and calculating the mean of a plurality of residue terms may be referred to as aggregation of residue terms and may be used for determining a signal correction value at block 548.

At block 548, a signal correction value may be determined. For example, the signal correction circuit may use the mean of residue terms from block 544 as a signal correction value for a corresponding input signal value in the input signal data stream.

At block 550, the correction value may be applied to the input signal. For example, the signal correction circuit may add the signal correction value to the input signal value or values for one or more samples, bits, or symbols from which the signal correction value was determined. The resulting corrected signal values may form a corrected signal for a next iteration of the SOVA detector.

Technology for improved data protection in multiple actuator data storage devices using monitoring of coupling states across actuators during concurrent operations is described above. In the above description, for purposes of explanation, numerous specific details were set forth. It will be apparent, however, that the disclosed technologies can be practiced without any given subset of these specific details. In other instances, structures and devices are shown in block diagram form. For example, the disclosed technologies are described in some implementations above with reference to particular hardware.

Reference in the specification to "one embodiment" or "an embodiment" means that a particular feature, structure, or characteristic described in connection with the embodiment is included in at least one embodiment or implementation of the disclosed technologies. The appearances of the phrase "in one embodiment" in various places in the specification are not necessarily all referring to the same embodiment or implementation.

Some portions of the detailed descriptions above may be presented in terms of processes and symbolic representations of operations on data bits within a computer memory. A process can generally be considered a self-consistent sequence of operations leading to a result. The operations may involve physical manipulations of physical quantities. These quantities take the form of electrical or magnetic signals capable of being stored, transferred, combined, compared, and otherwise manipulated. These signals may be referred to as being in the form of bits, values, elements, symbols, characters, terms, numbers, or the like.

These and similar terms can be associated with the appropriate physical quantities and can be considered labels applied to these quantities. Unless specifically stated otherwise as apparent from the prior discussion, it is appreciated that throughout the description, discussions utilizing terms for example "processing" or "computing" or "calculating" or "determining" or "displaying" or the like, may refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The disclosed technologies may also relate to an apparatus for performing the operations herein. This apparatus may be specially constructed for the required purposes, or it may include a general-purpose computer selectively activated or reconfigured by a computer program stored in the computer. Such a computer program may be stored in a computer readable storage medium, for example, but not limited to, any type of disk including floppy disks, optical disks, CD-ROMs, and magnetic disks, read-only memories (ROMs), random access memories (RAMs), erasable programmable read-only memories (EPROMs), electrically erasable programmable read-only memories (EEPROMs), magnetic or optical cards, flash memories including universal serial bus (USB) keys with non-volatile memory or any type of media suitable for storing electronic instructions, each coupled to a computer system bus.

The disclosed technologies can take the form of an entire hardware implementation, an entire software implementation or an implementation containing both hardware and software elements. In some implementations, the technology is implemented in software, which includes but is not limited to firmware, resident software, microcode, etc.

Furthermore, the disclosed technologies can take the form of a computer program product accessible from a non-transitory computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

A computing system or data processing system suitable for storing and/or executing program code will include at least one processor (e.g., a hardware processor) coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modems, and Ethernet cards are just a few of the currently available types of network adapters.

The terms storage media, storage device, and data blocks are used interchangeably throughout the present disclosure to refer to the physical media upon which the data is stored.

Finally, the processes and displays presented herein may not be inherently related to any particular computer or other apparatus. Various general-purpose systems may be used with programs in accordance with the teachings herein, or it may prove convenient to construct more specialized apparatus to perform the required method operations. The required structure for a variety of these systems will appear from the description above. In addition, the disclosed technologies were not described with reference to any particular programming language. It will be appreciated that a variety of programming languages may be used to implement the teachings of the technologies as described herein.

The foregoing description of the implementations of the present techniques and technologies has been presented for the purposes of illustration and description. It is not intended to be exhaustive or to limit the present techniques and technologies to the precise form disclosed. Many modifications and variations are possible in light of the above teaching. It is intended that the scope of the present techniques and technologies be limited not by this detailed description. The present techniques and technologies may be implemented in other specific forms without departing from the spirit or essential characteristics thereof. Likewise, the particular naming and division of the modules, routines, features, attributes, methodologies and other aspects are not mandatory or significant, and the mechanisms that implement the present techniques and technologies or its features may have different names, divisions and/or formats. Furthermore, the modules, routines, features, attributes, methodologies and other aspects of the present technology can be implemented as software, hardware, firmware or any combination of the three. Also, wherever a component, an example of which is a module, is implemented as software, the component can be implemented as a standalone program, as part of a larger program, as a plurality of separate programs, as a statically or dynamically linked library, as a kernel loadable module, as a device driver, and/or in every and any other way known now or in the future in computer programming. Additionally, the present techniques and technologies are in no way limited to implementation in any specific programming language, or for any specific operating system or environment. Accordingly, the disclosure of the present techniques and technologies is intended to be illustrative, but not limiting.

What is claimed is:

1. A read channel circuit, comprising:
   at least one soft output detector configured to:
      receive an input signal;
      detect data bits within the input signal; and
      output detected data bits and corresponding soft information; and
   a signal correction circuit configured to:
      receive the detected data bits and corresponding soft information;
      determine, based on the corresponding soft information and a residue term, a signal correction value, wherein the signal correction circuit comprises:
         an expectation signal generator configured to generate expected signal values based on the detected data bits; and
         a residue calculator configured to compare the expected signal values to the input signal to determine the residue term; and
      return a corrected signal to the at least one soft output detector.

2. The read channel circuit of claim 1, wherein:
   the at least one soft output detector comprises:
      a front-end soft output detector configured to receive the input signal from an analog front-end circuit; and
      an iterative soft output detector configured to:
         receive the input signal from the front-end soft output detector; and
         receive the input signal from a prior iteration of the iterative soft output detector; and
   the signal correction circuit is further configured to correct the input signal from the front-end soft output detector and the prior iteration of the iterative soft output detector.

3. The read channel circuit of claim 2, wherein the iterative soft output detector is further configured to:
   selectively output the detected data bits and the corresponding soft information to an iterative decoder; and
   selectively receive decoder soft information from the iterative decoder.

4. The read channel circuit of claim 2, wherein the signal correction circuit comprises a switch configured to selectively receive the detected data bits and corresponding soft information from the front-end soft output detector and the iterative soft output detector.

5. The read channel circuit of claim 1, wherein the expected signal values include an alternating current coupling pole compensation value.

6. The read channel circuit of claim 1, wherein the signal correction circuit further comprises:
   a low confidence zeroing logic configured to:
      receive the corresponding soft information for a selected symbol in the detected data bits;
      compare the corresponding soft information for the selected symbol to a confidence threshold; and
      selectively zero out, based on the corresponding soft information for the selected symbol being below the confidence threshold, the residue term for the selected symbol.

7. The read channel circuit of claim 1, wherein the signal correction circuit further comprises:
   a residue aggregator configured to:
      store a plurality of residue terms from the residue calculator; and
      aggregate the plurality of residue terms to determine the signal correction value; and
   a signal correction logic configured to apply the signal correction value to the input signal to determine the corrected signal.

8. The read channel circuit of claim 7, wherein the residue aggregator is further configured to aggregate the plurality of residue terms over a moving window of symbols in the detected data bits by calculating a mean value of the plurality of residue terms in the moving window at a selected time.

9. The read channel circuit of claim 1, wherein the expected signal values include compensation values selected from direct current offset values, alternating current coupling pole compensation values, and signal asymmetry compensation values.

10. A data storage device comprising the read channel circuit of claim 1.

11. A method comprising:
    receiving, in at least one soft output detector, an input signal;
    detecting, by the at least one soft output detector, data bits within the input signal;
    outputting, by the at least one soft output detector, detected data bits and corresponding soft information;
    receiving, by a signal correction circuit, the detected data bits and corresponding soft information;
    generating, in the signal correction circuit, expected signal values based on the detected data bits;
    comparing the expected signal values to the input signal to determine a residue term;
    determining, by the signal correction circuit and based on the corresponding soft information and the residue term, a signal correction value; and
    returning a corrected signal to the at least one soft output detector.

12. The method of claim 11, further comprising:
    processing the input signal through an analog front-end circuit, wherein a front-end soft output detector receives the input signal from the analog front-end circuit;
    correcting, using the signal correction circuit, the input signal to return a first corrected signal to an iterative soft output detector;

processing, using the iterative soft output detector, the first corrected signal as the input signal for a first iteration of the iterative soft output detector; and correcting, using the signal correction circuit, the input signal to return a subsequent corrected signal for a next iteration of the iterative soft output detector.

13. The method of claim 12, further comprising:

selectively outputting, from the iterative soft output detector, the detected data bits and the corresponding soft information to an iterative decoder; and selectively receiving, in the iterative soft output detector, decoder soft information from the iterative decoder.

14. The method of claim 12, further comprising:

switching a connection to the signal correction circuit between the front-end soft output detector and the iterative soft output detector to selectively receive the detected data bits and corresponding soft information from the front-end soft output detector and the iterative soft output detector.

15. The method of claim 11, wherein the expected signal values include an alternating current coupling pole compensation value.

16. The method of claim 11, further comprising:

determining the corresponding soft information for a selected symbol in the detected data bits;

comparing the corresponding soft information for the selected symbol to a confidence threshold; and selectively zeroing out, based on the corresponding soft information for the selected symbol being below the confidence threshold, the residue term for the selected symbol.

17. The method of claim 11, further comprising:

storing a plurality of residue terms for a series of selected symbols;

aggregating the plurality of residue terms to determine the signal correction value; and applying the signal correction value to the input signal to determine the corrected signal.

18. The method of claim 17, further comprising:

determining, for a selected symbol, a moving window of adjacent symbols in the detected data bits; and calculating, for the selected symbol, a mean value of the plurality of residue terms in the moving window to determine the signal correction value.

19. The method of claim 11, wherein the expected signal values include compensation values selected from direct current offset values, alternating current coupling pole compensation values, and signal asymmetry compensation values.

20. A system comprising:

means for detecting data bits within an input signal configured to:

receive an input signal;

detect data bits within the input signal; and output detected data bits and corresponding soft information; and means for correcting the input signal configured to:

receive the detected data bits and corresponding soft information;

generate expected signal values based on the detected data bits;

compare the expected signal values to the input signal to determine a residue term;

determine, based on the corresponding soft information and the residue term, a signal correction value; and return a corrected signal to the means for detecting data bits within the input signal.

21. A read channel circuit, comprising:

at least one soft output detector configured to:

receive an input signal;

detect data bits within the input signal; and output detected data bits and corresponding soft information, wherein the at least one soft output detector comprises:

a front-end soft output detector configured to receive the input signal from an analog front-end circuit; and an iterative soft output detector configured to:

receive the input signal from the front-end soft output detector; and receive the input signal from a prior iteration of the iterative soft output detector; and a signal correction circuit configured to:

receive the detected data bits and corresponding soft information;

determine, based on the corresponding soft information, a signal correction value; and return a corrected signal to the at least one soft output detector, wherein the signal correction circuit comprises a switch configured to selectively receive the detected data bits and corresponding soft information from the front-end soft output detector and the iterative soft output detector.

\* \* \* \* \*